United States Patent
Luizzi et al.

(10) Patent No.: US 10,962,766 B2
(45) Date of Patent: Mar. 30, 2021

(54) ADHESIVE BONDED MICRO ELECTRO MECHANICAL SYSTEM

(71) Applicant: Microsoft Technology Licensing, LLC, Redmond, WA (US)

(72) Inventors: Joseph Michael Luizzi, Sammamish, WA (US); Seungwoo Lee, Bothell, WA (US); Utku Baran, Seattle, WA (US); Michael James Nystrom, Mercer Island, WA (US); Robert J. Dyer, Everett, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 281 days.

(21) Appl. No.: 16/239,418

(22) Filed: Jan. 3, 2019

(65) Prior Publication Data
US 2020/0218060 A1    Jul. 9, 2020

(51) Int. Cl.
G02B 26/08    (2006.01)
G02B 26/10    (2006.01)
B81C 3/00    (2006.01)
G02B 27/01    (2006.01)

(52) U.S. Cl.
CPC .......... G02B 26/0858 (2013.01); B81C 3/001 (2013.01); G02B 26/101 (2013.01); G02B 27/0176 (2013.01); B81C 2203/032 (2013.01); G02B 2027/0154 (2013.01)

(58) Field of Classification Search
CPC .............. G02B 26/0858; G02B 26/101; G02B 27/0176; G02B 2027/0154; G02B 26/0841; G02B 26/085; G02B 26/0866; G02B 26/105; G02B 26/121; B81C 3/001; B81C 2203/032; B81B 2201/042; B81B 7/0006
USPC ...................................................... 359/198.1
See application file for complete search history.

(56) References Cited

U.S. PATENT DOCUMENTS

| 6,476,986 | B2 | 11/2002 | Smith et al. |
| 7,184,186 | B2 | 2/2007 | Guynn et al. |
| 7,184,618 | B2 | 2/2007 | Kenagy et al. |
| 7,236,658 | B2 | 6/2007 | Uesugi et al. |
| 7,493,004 | B2 | 2/2009 | Tekippe |
| 7,708,415 | B2 | 5/2010 | Griffith et al. |
| 7,952,178 | B2 | 5/2011 | Rancuret et al. |
| 9,810,900 | B2 | 11/2017 | Camet et al. |
| 2013/0278907 | A1* | 10/2013 | Abele .................. G02B 5/0215 353/98 |

(Continued)

FOREIGN PATENT DOCUMENTS

| JP | 5229242 B2 | 7/2013 |
| JP | 2014122976 A | 7/2014 |

*Primary Examiner* — William R Alexander
*Assistant Examiner* — Henry A Duong
(74) *Attorney, Agent, or Firm* — Alleman Hall Creasman & Tuttle LLP

(57) ABSTRACT

A micro electro mechanical system is provided. The micro electro mechanical system includes a first part bonded to a second part by a structural adhesive interface. The structural adhesive interface includes a conductive structural adhesive portion, and a non-conductive structural adhesive portion at least partially surrounding the conductive structural adhesive portion. The conductive structural adhesive portion and the non-conductive structural adhesive portion have a thixotropy index greater than one.

20 Claims, 11 Drawing Sheets

(56) References Cited

U.S. PATENT DOCUMENTS

2018/0050530 A1* 2/2018 Tsuchiya .................. B41J 2/161
2018/0259765 A1* 9/2018 Ellis ................... G02B 26/0833

* cited by examiner

600

```
┌─────────────────────────────────────────────────────────────────────┐
│  DEPOSITING A STRUCTURAL ADHESIVE INTERFACE ONTO A SURFACE OF THE   │
│  FIRST PART, THE STRUCTURAL ADHESIVE INTERFACE INCLUDING A          │
│  CONDUCTIVE STRUCTURAL ADHESIVE PORTION, AND A NON-CONDUCTIVE       │
│  STRUCTURAL ADHESIVE PORTION AT LEAST PARTIALLY SURROUNDING THE     │
│  CONDUCTIVE STRUCTURAL ADHESIVE PORTION, AND WHEREIN THE CONDUCTIVE │
│  STRUCTURAL ADHESIVE PORTION AND THE NON-CONDUCTIVE STRUCTURAL      │
│  ADHESIVE PORTION HAVE A THIXOTROPY INDEX GREATER THAN ONE 602      │
└─────────────────────────────────────────────────────────────────────┘
                                     ↓
┌─────────────────────────────────────────────────────────────────────┐
│   MOUNTING A SECOND PART ONTOP OF THE DEPOSITED STRUCTURAL ADHESIVE │
│                            INTERFACE 604                            │
└─────────────────────────────────────────────────────────────────────┘
                                     ↓
┌─────────────────────────────────────────────────────────────────────┐
│              CURING THE STRUCTURAL ADHESIVE INTERFACE 606           │
└─────────────────────────────────────────────────────────────────────┘
```

FIG. 7

| ADHESIVE NAME | MANUFACTURER | TYPE | THIXOTROPY INDEX | SHEAR STRENGTH (MPa) | VISCOSITY (MPa-s) |
|---|---|---|---|---|---|
| TKS100 GR1 | KYORITSU | MODIFIED EPOXY | 2.4 | 54.6 | 32,000 |
| FH8801C | HB FULLER | CONDUCTIVE STRUCTURAL ACRYLIC | 3.9 | 24.0 | 8,300 |
| ABLESTIK 2035SC | HENKEL | BMI/ACRYLATE SILICA FILLED | 4.2 | 39.2 | 11,000 |
| MONOPOX DA 255 | DELO | MODIFIED EPOXY | 3.8 | 48 | 25000 |

FIG. 8A

| ADHESIVE CURE CONDITIONS | | TKS-100 GR1 | FH8801C | MONOPOX DA 255 |
|---|---|---|---|---|
| CONDUCTIVE STRUCTURAL ADHESIVES | ABLESTICK 2035C | 30 MIN AT 80° C | | 50 MIN AT 90° C |
| | | 20 MIN AT 110° C | | 20 MIN AT 110° C |

FIG. 8B

| ADHESIVE NAME | MANUFACTURER | TYPE | THIXOTROPY INDEX | UV DOSE CURE CONDITIONS mJ/cm² | VISCOSITY (MPa-s) |
|---|---|---|---|---|---|
| EA6405 | HB FULLER | ACRYLATE | 10.8 | 800 | 48,000 |
| A1853-TX | ADDISON CLEAR WAVE | CATIONIC EPOXY | 7 | 8000 | 8,300 |
| OB786 | DELO | EPOXY | 5.1 | 5000 | 27,000 |

FIG. 9

ADHESIVE BONDED MICRO ELECTRO MECHANICAL SYSTEM

BACKGROUND

Adhesives are used in the assembly of micro electro mechanical systems (MEMS), such as modular scanners for scanning laser devices. The rheological properties of these adhesives during deposition and curing has a strong effect on the performance of the MEMS device.

SUMMARY

A micro electro mechanical system is provided. The micro electro mechanical system includes a first part bonded to a second part by a structural adhesive interface. The structural adhesive interface includes a conductive structural adhesive portion, and a non-conductive structural adhesive portion at least partially surrounding the conductive structural adhesive portion. The conductive structural adhesive portion and the non-conductive structural adhesive portion have a thixotropy index greater than one.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 7 shows an example method for bonding a first part and a second part of a micro electro mechanical system of the display device of FIG. 1.

FIG. 8A shows a chart of example adhesive materials for the structural adhesive interfaces of FIG. 1.

FIG. 8B shows a chart of adhesive cure conditions for the example adhesive materials of FIG. 8A.

FIG. 9 shows a chart of example adhesive materials for the structural adhesive interfaces of FIG. 1.

DETAILED DESCRIPTION

Fast Scan Mirror assemblies, such as, for example, compact Modular Scanners for Scanning Laser Devices are micro electro mechanical systems (MEMS) devices. An example scanning mirror system may include a silicon mirror and piezo actuators attached to a metal frame that may also be bonded to a printed circuit board. These components may be bonded using structural adhesives. In one example, the structural adhesive may include a thermoset conductive adhesive portion configured to conduct electricity to the example MEMS device. The electricity conducted by the conductive adhesive to the piezo actuator and the silicon mirror of the example MEMS device may cause the mirror to flex. In this manner, the mirror may be tilted at a high frequency via piezo actuation. Typically, the range for the angle of tilt of the mirror is limited by the strength and quality of the structural bond between the foot of the silicon mirror and the metal frame.

However, the adhesives that are typically used to bond MEMS devices have unsuitable properties that cause co-mingling of the conductive and non-conductive adhesives. The co-mingling of the adhesives causes a wide variance observed in conductance properties of the structural adhesive, which may result in less than optimum Fast Scan MEMS performance.

Figure 1:
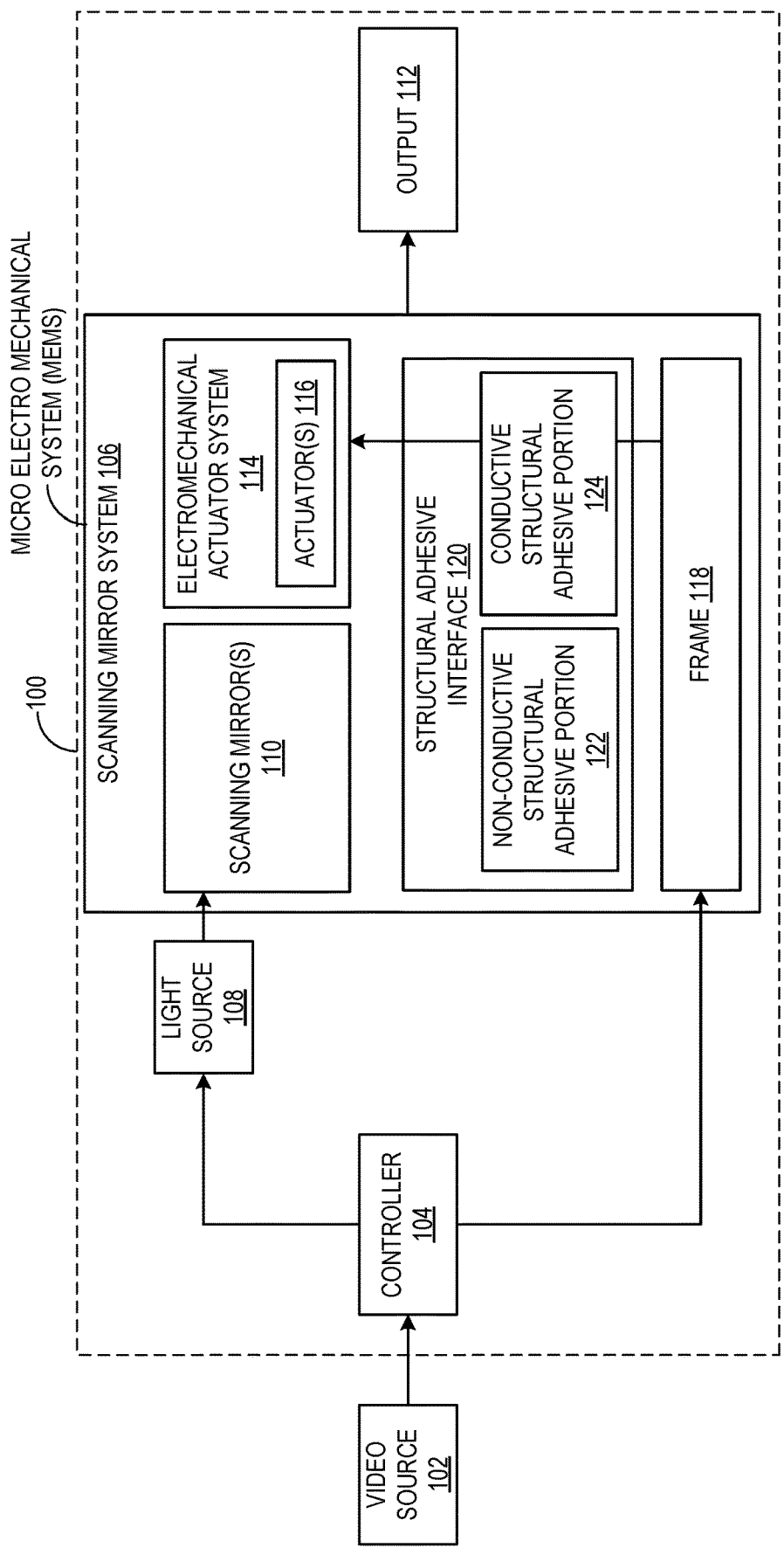
FIG. 1 shows a schematic view of an example display device that includes a micro electro mechanical system bonded by structural adhesive interfaces.

FIG. 1 schematically shows an example display device 100 in communication with a video source 102. Display device 100 includes a controller 104 operatively coupled to a scanning mirror system 106 and to a light source 108. Controller 104 is configured to control light source 108 to emit light based on video image data received from video source 102. Light source 108 may include any suitable light-emitting element(s), such as one or more lasers, and may output light in any suitable wavelength ranges, such as red, green, and blue. In other examples, light source 108 may output substantially monochromatic light, or other wavelength bands than red/green/blue.

Scanning mirror system 106 comprises one or more scanning mirrors 110 controllable to vary an angle at which light from the light source is reflected to thereby scan an image. As mentioned above, the scanning mirror system 106 may include a single mirror driven in both horizontal and vertical directions, or two mirrors separately driven in horizontal and vertical directions. Light reflected by scanning mirror system 106 is directed toward an output 112 for display of a scanned image. Output 112 may take any suitable form, such as projection optics, waveguide optics, etc. As examples, display device 100 may be configured as a virtual reality head-mounted display (HMD) device with output 110 configured as an opaque surface, or as an augmented reality HMD device with the output configured as a see-through structure that allows virtual imagery to be combined with a view of the surrounding real-world environment. Display device 100 also may assume other suitable forms, such as that of a head-up display, mobile device screen, monitor, or television, as examples.

Scanning mirror system 106 further includes an electromechanical actuator system 114 comprising actuator(s) 116 to effect movement of the scanning mirror(s) 110. Various type of actuators may be used to control a MEMS mirror system.

As illustrated in FIG. 1, one or more of the scanning mirror(s) 110 and the electromechanical actuator system 114 are bonded to a frame 118 by a structural adhesive interface 120. In one example, the structural adhesive interface 120 includes both a non-conductive structural adhesive portion 122 and a conductive structural adhesive portion 124 arranged such that the non-conductive structural adhesive portion 122 at least partially surrounds and encompasses the conductive structural adhesive portion 124. The controller 104 may be configured to drive the actuator(s) 116 of the electromechanical actuator system 114 via electricity conducted through the frame 118 and the conductive structural adhesive portion 124 to the actuator(s) 116.

Figure 2B:
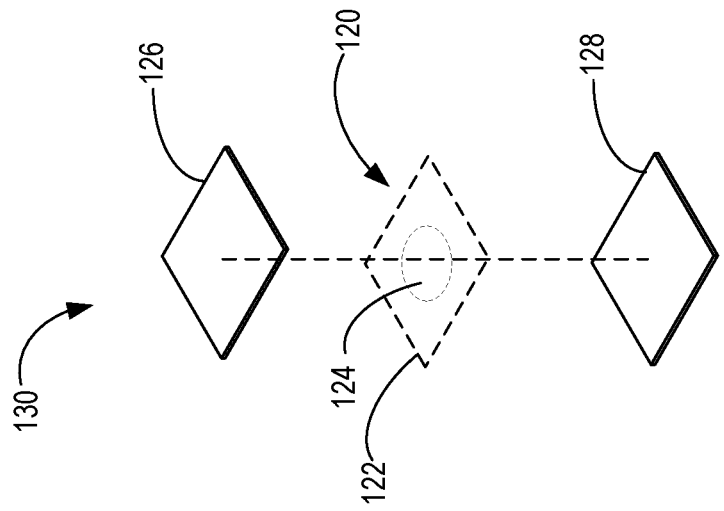
FIG. 2B shows an exploded view of the example device of FIG. 2A.
Figure 2A:
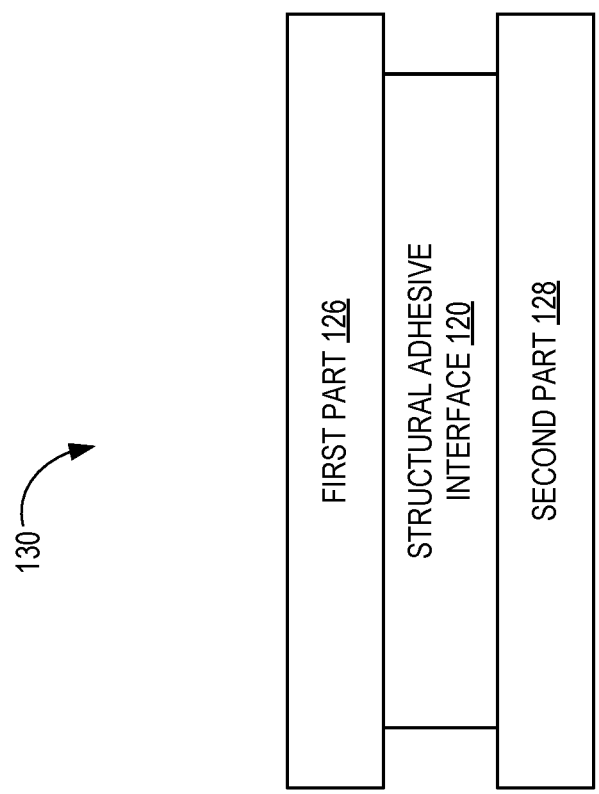
FIG. 2A shows a schematic view of an example device that includes a first part and a second part bonded by a structural adhesive interface.

FIGS. 2A and 2B illustrate an example device 130 that includes a first part 126 bonded to a second part 128 by a structural adhesive interface 120. In this example, the structural adhesive interface 120 may include a conductive structural adhesive portion 120, and a non-conductive structural adhesive portion 122 at least partially surrounding the conductive structural adhesive portion 120. The example device 130 may take any suitable form, such as, for example, the scanning mirror system 106 of FIG. 1, portions of the example scanning mirror system 200 of FIGS. 3-5, and other forms. In scanning mirror system examples, the first part 126 may take the form of an electromechanical actuator 116, and the second part 128 may take the form of a frame 118. Further in this example, the first part 126 may take the form of a portion of scanning mirror 110, and the second part 128 may take the form of the frame 118. However, it should be appreciated that the example device 130 is not limited to scanning mirror system forms, and may take the form of other suitable types of MEMS devices.

Figure 3:
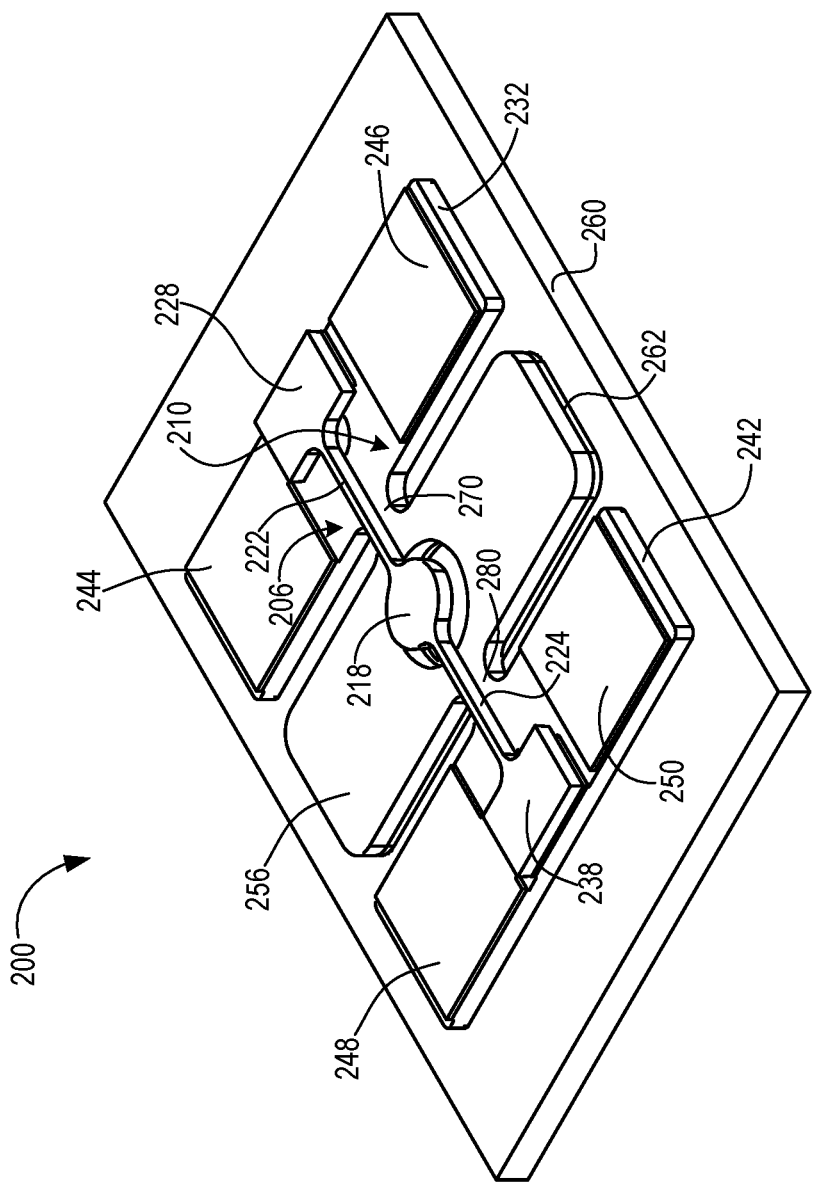
FIG. 3 shows an example scanning mirror system for the example display device of FIG. 1.
Figure 4:
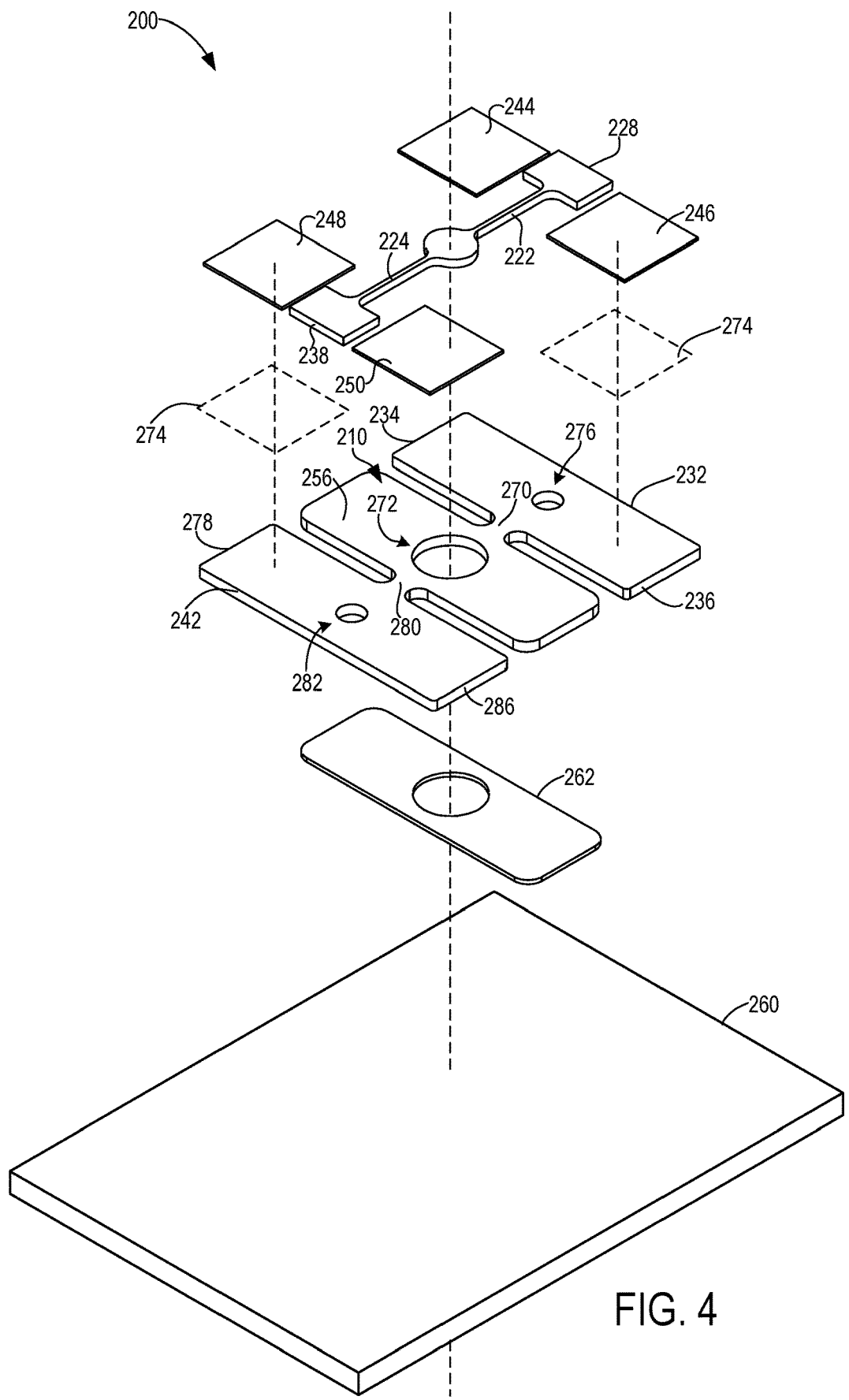
FIG. 4 shows an exploded view of the scanning mirror system of FIG. 3.
Figure 5:
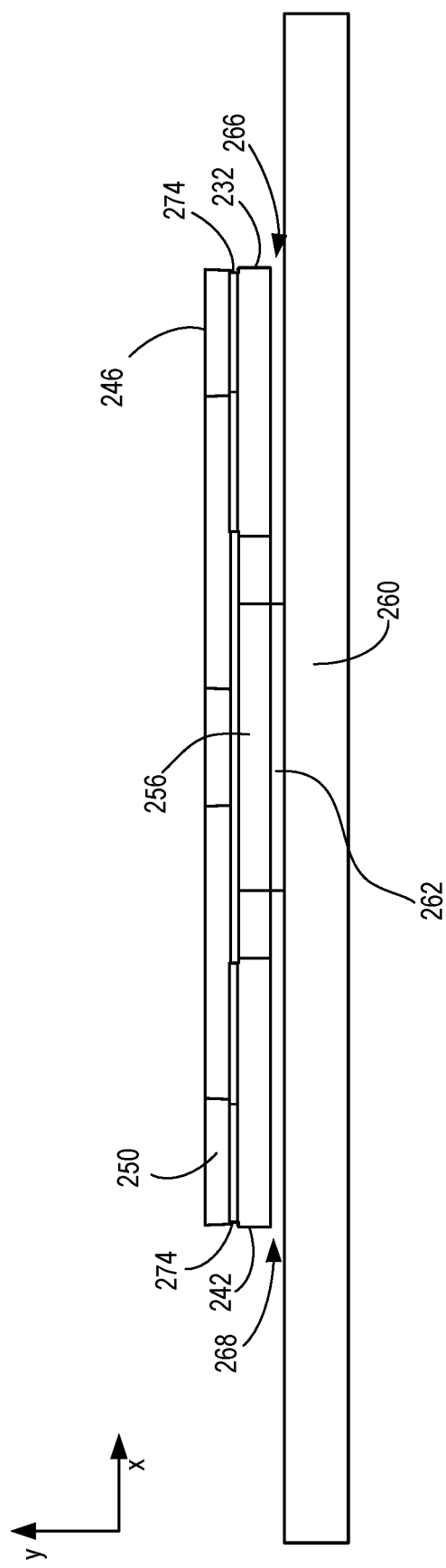
FIG. 5 shows a side view of the scanning mirror system of FIG. 3.

FIGS. 3-5 show a specific example of a scanning mirror system 200 that includes a scanning mirror assembly 206 comprising an example of an actuator frame 210. Scanning mirror assembly 206 comprises a MEMS mirror 218 attached to the actuator frame 210 via a first flexure 222 and a second flexure 224. First and second flexures 222 and 224 may provide respective pivots via which mirror 218 can rotate and thereby change its angular orientation to vary the angle at which light from a light source is reflected. Mirror 218 may scan in a horizontal or vertical direction, depending upon an orientation in which scanning mirror system 200 is incorporated into a display device.

The first flexure 222 of scanning mirror assembly 206 is connected to a first anchor portion 228. This first anchor portion is affixed to a first moveable member 232 of the actuator frame 210 by a structural adhesive interface. In a similar manner, the second flexure 224 of scanning mirror assembly 206 is connected to a second anchor portion 238 that is affixed to a second moveable member 242 of the actuator frame 210 by a structural adhesive interface. As described in more detail below, actuators affixed to the moveable members are controlled to cause corresponding movement in the mirror 218.

In this example, the scanning mirror system 200 includes an electromechanical actuator system comprising a first actuator pair affixed to the first moveable member 232 adjacent to the first flexure 222, and a second actuator pair affixed to the second moveable member 242 adjacent to the second flexure 224. The first actuator pair comprises first actuator 244 and second actuator 246, and the second actuator pair comprises third actuator 248 and fourth actuator 250.

The actuators may be controlled to cause a desired oscillation in the mirror 218. For example, the actuators may comprise a lead zirconate titanate (PZT) material or piezoelectric ceramic material that changes dimension based upon an applied voltage. For example, upon receiving an electrical signal having a first polarity (e.g., positive), actuators 244 and 248 may apply a contractive force to portions of moveable members 232 and 242, respectively, underlying these actuators. On the other hand, upon receiving the electric signal having the first polarity, actuators 246 and 250 may apply a dilative force to portions of moveable members 232 and 242, respectively, underlying these actuators. An electrical signal having a second, different polarity (e.g., negative) may cause actuators 244 and 248 to apply a dilative force to the respective underlaying portions of the moveable members, and may cause actuators 246 and 250 to apply a contractive force to the respective underlaying portions of the moveable members 232 and 242. The magnitude of force applied by actuators 244, 246, 248 and 250 may be controlled by controlling the magnitude of an electrical signal applied to the actuators. As discussed above, the electrical signal applied to the actuators may be conducted through the conductive structural adhesive portion 124 of the structural adhesive interface 120 bonding each actuator to respective underlaying portions of the moveable members 232 and 242. In this manner, the electrical signal may be applied to the conductive material of the actuator frame 210 and conducted to each of the actuators 244, 246, 248 and 250 via the conductive structural adhesive portion 124.

In other examples the electromechanical actuator system of scanning mirror system 200 may utilize any suitable type of actuators. For example, each actuator may comprise a magnetic actuator, wherein a magnetic force between magnetic elements can be varied via electrical signal. In other examples, each actuator may comprise an electrostatic actuator, where an electric field between electrodes can be varied to adjust contractive or dilative forces. As a further example, each electromechanical actuator may utilize one or more bimetallic strips, where differing coefficients of thermal expansion of different materials can be leveraged to vary the applied forces. It will also be appreciated that actuator(s) of an electromechanical actuator system may be arranged at other suitable locations in a scanning mirror system.

In this example, a central mounting member 256 of the actuator frame 210 is affixed to an underlying substrate 260 via a spacer 262. In some examples the actuator frame 210 may comprise a metallic material, such as steel, and the substrate 260 may comprise a PCB, ceramic material, or any other suitable material. The spacer 262 may comprise any suitable metallic material, such as steel. The central mounting member 256 may be bonded to the spacer 262, and the spacer bonded to the substrate 260 via the structural adhesive interface 120, such that an electric signal may be conducted from the substrate 260 to the actuators 244, 246, 248 and 250.

In the example of FIGS. 3-5, spacer 262 elevates the actuator frame 210 above the substrate 260 to thereby enable movement of the moveable members 232 and 242. More particularly and as shown in FIG. 5, spacer 262 creates gaps 266 and 268 between moveable members 232 and 242, respectively, and the underlying substrate 260. In this manner, the first moveable member 232 and the second moveable member 242 float above the substrate 260, and thereby may cause movement of the mirror 218 via flexures 222 and 224. In one example, each of the gaps 266 and 268 may be approximately 0.4 mm to 0.6 mm, or more specifically 0.5 mm, to enable y-axis movement of the first moveable member 232 and second moveable member 242 relative to the substrate 260. In other examples, any other suitable gap distances may be utilized to accommodate different scanning mirror system configurations and desired mirror movements. In the present example, the spacer 262 has substantially the same shape as the mounting member 256 of the actuator frame 210. In other examples, the spacer 262 may have a shape different from the mounting member 256. As shown in FIG. 4, the actuators 244, 246, 248 and 250 are bonded to respective underlaying portions of the moveable members 232 and 242 of the actuator frame 210 by structural adhesive interfaces 274.

As illustrated in FIG. 4, the actuator frame 210 comprises a first hinge 270 that connects a central portion 272 of the mounting member 256 with a central portion 276 of the first moveable member 232. In this example, the first hinge 270 is located substantially equidistant from the opposing ends 234 and 236 of the first moveable member 232. Similarly, the central portion 276 of the first moveable member 232 is located substantially midway between the opposing ends 234 and 236 of the first moveable member. In this example, both central portion 272 and central portion 276 comprise an aperture. It will be appreciated that in other examples, the mounting member 256 and first moveable member 232 may have different configurations that include one or more apertures of different shapes, sizes, and/or locations, or configurations that include no apertures.

In a similar manner, actuator frame 210 comprises a second hinge 280 that connects central portion 272 of the mounting member 256 with a central portion 282 of the second moveable member 242. As with the first hinge 270, the second hinge 280 is located substantially equidistant from the opposing ends 278 and 286 of the second moveable member 242. The central portion 282 of the second moveable member 242 is also located substantially midway between the opposing ends 278 and 286 of the second moveable member. In this example, both central portion 272 and central portion 282 comprise an aperture. As with the first moveable member 232, in other examples the mounting member 256 and second moveable member 242 may have different configurations that include apertures of different shapes, sizes, and/or locations, or configurations that include no apertures. In some examples, actuator frame 210 may be formed from micromachined silicon dies.

As illustrated in FIG. 4, each of the actuators 244, 246, 248, and 250 may be bonded to respective unlaying portions of the moveable members 232 and 242 of the actuator frame 210 by structural adhesive interfaces 274 shown in more detail in FIG. 6. In one example, the anchor portion 228 and 238 connected to the mirror 218 may also be bonded to underlaying portions of the moveable members 232 and 242 by structural adhesive interfaces 274.

Figure 6A:
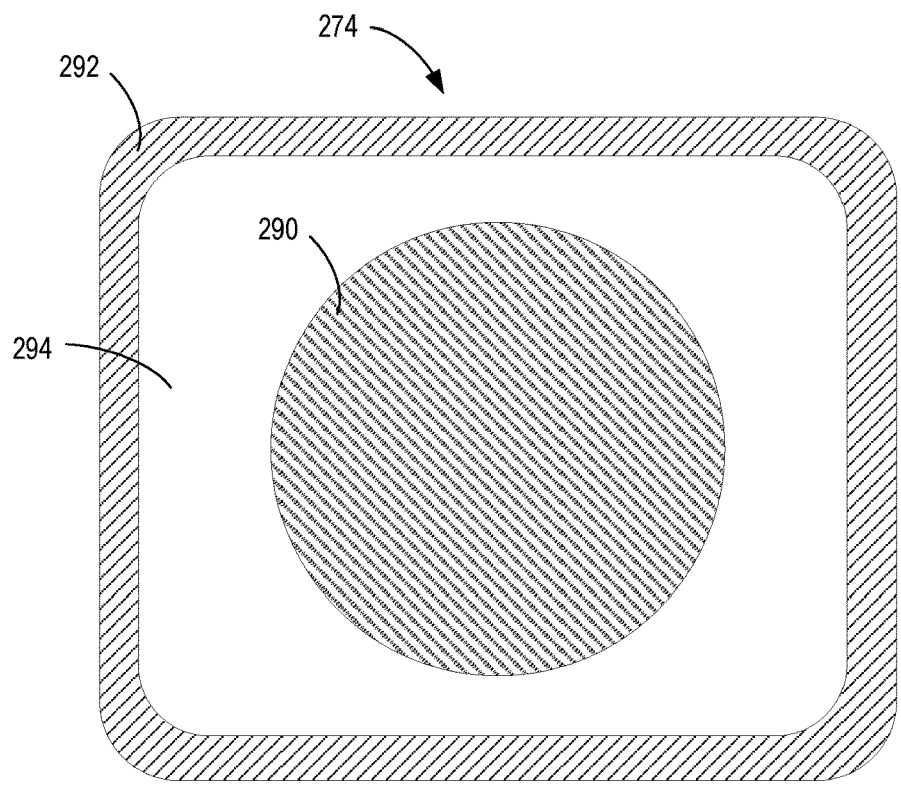
FIG. 6A shows a schematic top down view of a deposition pattern for the structural adhesive interfaces of FIG. 1.

FIG. 6A illustrates an example deposition pattern of the structural adhesive interface 274. As discussed above, the structural adhesive interface 274 includes a conductive structural adhesive portion 290 and a non-conductive structural adhesive portion 292. In the example deposition pattern shown in FIG. 6A, the non-conductive structural adhesive portion 292 is deposited to be surrounding the conductive structural adhesive portion 290, such that the non-conductive structural adhesive portion 292 encompasses and insulates the conductive structural adhesive portion 290 in the two-dimensional plane of FIG. 6A. In some examples, the deposition pattern may further include a gap 294 between the non-conductive structural adhesive portion 292 and the conductive structural adhesive portion 290. The gap 294 may be filled with a substantially non-conductive fluid or gas, such as, for example, air. Other example deposition patterns may not include a gap 294 between the non-conductive structural adhesive portion 292 and the conductive structural adhesive portion 290. Further, it should be appreciated that while the non-conductive structural adhesive portion 292 is depicted as being deposited in a rounded square/donut shape, the non-conductive structural adhesive portion 292 may be deposited in other types of geometric patterns, such as, for example, a triangle, a square, a circle, an ellipse, and other shapes with an open center. Further, it should be appreciated that while the conductive structural adhesive portion 290 is depicted as being deposited in a circular shape, the conductive structural adhesive portion 290 may be deposited in other types of geometric patterns, such as, for example, a triangle, a square, a circle, an ellipse, etc.

Figure 6B:
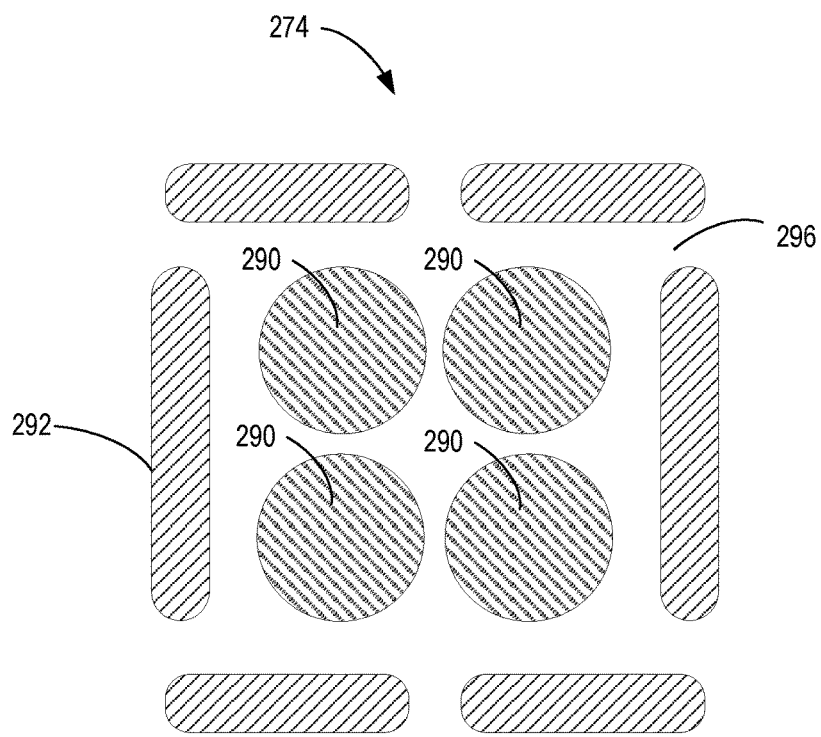
FIG. 6B shows a schematic top down view of another deposition pattern for the structural adhesive interfaces of FIG. 1.

FIG. 6B illustrates another example deposition pattern of the structural adhesive interface 274. In this example deposition pattern, the structural adhesive interface 274 includes a plurality of conductive structural adhesive portions 290 and a non-conductive structural adhesive portion 292 that is deposited to be at least partially surrounding the plurality of conductive structural adhesive portions 290. In the example illustrated in FIG. 6B, the deposition pattern of the non-conductive structural adhesive portion 292 includes perforations or spaces 296 such that the non-conductive structural adhesive portion 292 partially, but not completely, surrounds and encompasses the conductive structural adhesive portions 290 in the two-dimensional plane of FIG. 6B.

Further, it should be appreciated that other types of deposition patterns may be utilized for the structural adhesive interface 274. In one example, the deposition pattern for the conductive and non-conductive structural adhesive portions may be reversed. That is, the conductive structural adhesive portion 290 may be deposited to at least partially surround the non-conductive adhesive portion 292. It should be appreciated that other deposition patterns not specifically mentioned herein may also be utilized for depositing the structural adhesive interface 274.

A method for depositing and curing the structural adhesive interface shown in FIGS. 6A and 6B will now be described, followed by a discussion of the materials properties of this interface with reference to FIGS. 8A, 8B, and 9. FIG. 7 is a flow chart of a method 600 for bonding a first part and a second part of a micro electro mechanical system. Method 600 may be implemented on the example scanning mirror system 200 described above.

At 602, the method 600 may include depositing a structural adhesive interface onto a surface of the first part, the structural adhesive interface including a conductive structural adhesive portion, and a non-conductive structural adhesive portion at least partially surrounding the conductive structural adhesive portion. Thus, at step 602, the example deposition pattern of the structural adhesive interface shown in FIGS. 6A and 6B may be deposited. However, it should be appreciated that other types of deposition patterns may be formed at step 602 of method 600.

The deposition of step 602 may be used in a micro electro mechanical system such as a scanning mirror system, as described above, which includes an actuator frame that includes a mounting member, a first movable member, a second moveable member, a first hinge connecting a central portion of the mounting member with the first movable member, and a second hinge connecting the central portion of the mounting member with the second moveable member. The first part may comprise the first moveable member and/or the second moveable member. The scanning mirror system may further include a plurality of electromechanical actuators bonded to the first moveable member and the second moveable member via structural adhesive interfaces, and a scanning mirror assembly bonded to the first moveable member and the second moveable member. In this example, a controller may be configured to control a tilt of the mirror of the scanning mirror assembly by driving an electrical signal to the plurality of electromechanical actuators conducted through at least the conductive structural adhesive portion of the structural adhesive interfaces.

At 604, the method 600 may include mounting second part on top of the deposited structural adhesive interface. In the example described with reference to FIGS. 2-5, the second part may include one or more of the plurality of electromechanical actuators that are mounted on top of the structural adhesive interface deposited onto the first and second movable members.

At 606, the method 600 may include curing the structural adhesive interface. In one example, the structural adhesive interface may be a thermoset material, and may be cured in an oven. In another example, the structural adhesive may be cured using UV light. Examples adhesive materials are shown in FIGS. 8A, 8B, and 9. Further, at step 606, the conductive structural adhesive portion and the non-conductive structural adhesive portion may be concurrently cured. That is, both the conductive structural adhesive portion and the non-conductive structural adhesive portion may be deposited onto the first part before being concurrently cured in an oven. In one example, the adhesive materials of the structural adhesive interface are selected to have a cure time of less than 60 minutes. The particular material of the structural adhesive interface may be selected based on other different properties. In one example, the conductive structural adhesive portion and the non-conductive structural adhesive portion are selected to have a thixotropy index greater than one.

Adhesive materials that are typically used in MEMS devices may have a viscosity is too low, or becomes too low over time due to a low thixotropy at the time of application or during curing, resulting in co-mingling of the conductive and non-conductive adhesives, as these materials flow into each other. This unintended co-mingling may cause a wide variance in the conductance properties of the cured adhesives, which can adversely affect performance of the electromechanical actuators in response to a drive signal, resulting in degraded fast scan MEMS performance. Adhesives having specific properties, such as the example adhesives shown in FIGS. 8A and 9, may be utilized as the structural adhesive interface described above to control flow of the adhesive bond thickness during deposition and curing.

Several key properties of the adhesive materials have been identified for improving control over the flow of the adhesive materials during deposition and curing, resulting in improved fast scan MEMS performance compared to examples of typical MEMS devices, as follows.

(1) Thixotropy and Viscosity of the adhesive materials are useful to control flow during deposition and curing. Thixotropy is a time-dependent shear thinning property. Certain gels or fluids that are thick, or viscous, under static conditions will flow (become thin, less viscous) over time when shaken, agitated, sheared or otherwise stressed (time dependent viscosity). These materials take a fixed time to return to a more viscous state. Adhesive materials having a thixotropy index greater than one have been found to surprisingly provide the rheological properties necessary to be suitably deposited onto parts without undergoing excessive flow and co-mingling during heating and curing. More specifically, a thixotropy index of between 2 and 5 has been found to be suitable to avoid co-mingling as described above. FIG. 8A shows several examples of adhesive materials having a suitable thixotropy index within this range.

Additionally, adhesive materials having a viscosity greater than 1000 mPa-sec at 25° Celsius, and more particularly between 8000 and 35000 at 25° Celsius, have been found to improve control over flow and co-mingling during deposition of the adhesives.

(2) Shear strength is another property of the adhesive materials, the specification of which can affect the performance of the adhesive in a useful manner. Due to the high stress that may be imparted upon the bonds between components of the MEMS devices, adhesive materials having a high modulus value of shear strength result in improved performance in sustaining these stresses at a high frequency and angle of deformation. Mirrors bonded with adhesives having a low shear strength may result in degraded flex capability. Adhesive materials having a shear strength value of greater than twenty Mega Pascals (MPa) have been found to have improved performance and achieve a suitably high flex angle. More specifically, adhesive materials having shear strength value of between 20 and 55 have been found to have a suitable high flex angle.

(3) Thermosetting properties. The structural adhesive interfaces are thermoset materials that may be cured in an oven or via ultraviolet (UV) light curing after deposition. The cure time and cure temperature of the adhesive material has been found to be useful in controlling the flow of the adhesive materials that may occur while the adhesive materials are being deposited and cured. Structural adhesives having a cure time of less than 60 minutes, more particularly between 20 and 60 minutes, have been identified as improving control over the flow of the adhesive materials, resulting in improved performance of the MEMS device.

Additionally, adhesive materials having a coefficient of thermal expansion of less than 60 ppm/° C. have also been found to improve control over flow and help prevent co-mingling during curing of the adhesives.

Figure 10:
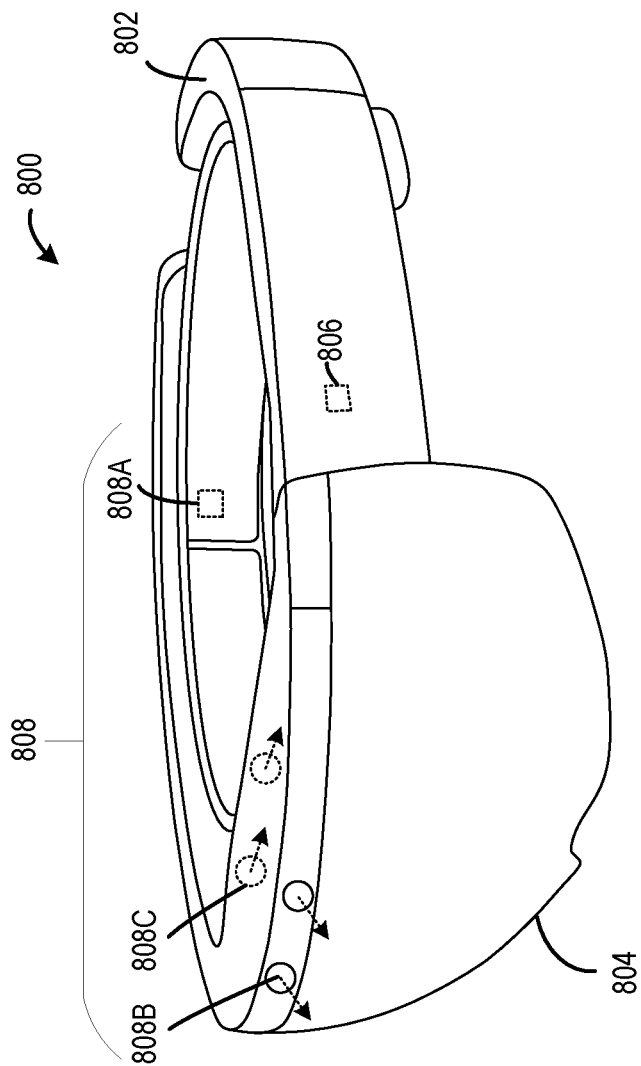
FIG. 10 shows a side perspective view of a computing device in the form of a head mounted display (HMD) device that includes the example display device of FIG. 1., according to one embodiment of the present description.

FIG. 10 shows an example head mounted display (HMD) device 800 that may include the example display device 100 illustrated in FIG. 1 and the example scanning mirror system 200 illustrated in FIGS. 3-5. The HMD device 800 may be worn by a user according to an example of the present disclosure. In other examples, an HMD device may take other suitable forms in which an at least partially see-through display is supported in front of a viewer's eye or eyes in an augmented reality HMD device configuration.

In the example of FIG. 10, the HMD device 800 includes a frame 802 that wraps around the head of the user to position a display device 804 close to the user's eyes. The display device 804, may, for example, take the form of the example display device 100 illustrated in FIG. 1 and described above. The frame supports additional components of the HMD device 800, such as, for example, a processor 806 and input devices 808. The processor 806 includes logic and associated computer memory configured to provide image signals to the display device 804, to receive sensory signals from input devices 808, and to enact various control processes described herein. The processor 806 may take the form of the controller 104 illustrated in FIG. 1.

The input devices 808 may include various sensors and related systems to provide information to the processor 806. Such sensors may include, but are not limited to, an inertial measurement unit (IMU) 808A, one or more outward facing image sensors 808B, and one or more inward facing image sensors 808C. The one or more inward facing image sensors 808B may be configured to acquire image data in the form of gaze tracking data from a wearer's eyes.

The one or more outward facing image sensors 808B may be configured to capture and/or measure physical environment attributes of the physical environment in which the HMD device 800 is located. In one example, outward facing image sensors 808b may include a visible-light camera configured to collect a visible-light image of a physical space. Further, the one or more outward facing image sensors 808B may include a depth camera configured to collect a depth image of a physical space. More particularly, in one example the depth camera is an infrared time-of-flight depth camera. In another example, the depth camera is an infrared structured light depth camera.

Data from the outward facing image sensors 808B may be used by the processor 806 to generate and/or update a three-dimensional (3D) model of the physical space. Data from the outward facing image sensors 808B may be used by the processor 806 to identify surfaces of the physical space and/or measure one or more surface parameters of the physical space. The processor 806 may execute instructions to generate/update virtual scenes displayed on display device 804 and identify surfaces of the physical space in any suitable manner.

In augmented reality configurations of HMD device 800, the position and/or orientation of the HMD device 800 relative to the physical environment may be assessed so that augmented-reality images may be accurately displayed in desired real-world locations with desired orientations. As noted above, the processor 806 may execute instructions to generate a 3D model of the physical environment including surface reconstruction information that may be used to identify surfaces in the physical space. In both augmented reality and non-augmented reality configurations of HMD device 800, the IMU 808A of HMD device 800 may be configured to provide position and/or orientation data of the HMD device 800 to the processor 806.

In some embodiments, the methods and processes described herein may be tied to a computing system of one or more computing devices. In particular, such methods and processes may be implemented as a computer-application program or service, an application-programming interface (API), a library, and/or other computer-program product.

Figure 11:
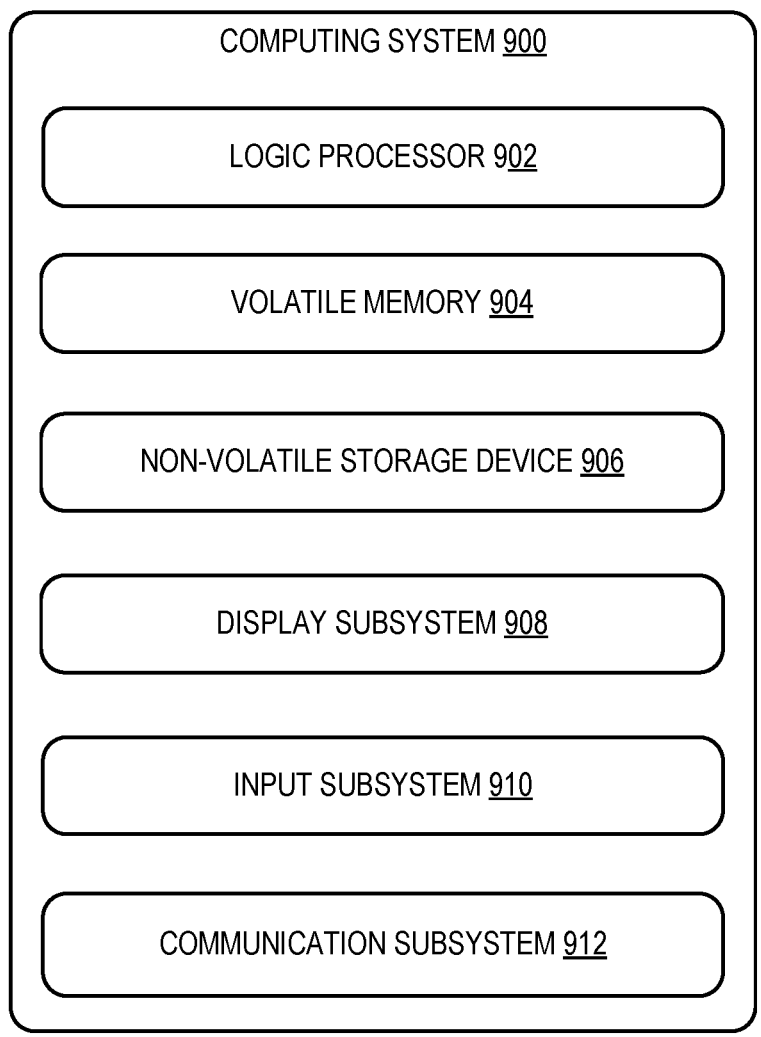
FIG. 11 shows a schematic view of an example computing environment in which the example display device of FIG. 1 may be enacted.

FIG. 11 schematically shows a non-limiting embodiment of a computing system 900 that can enact one or more of the methods and processes described above. Computing system 900 is shown in simplified form. Computing system 900 may embody the display device 100 described above and illustrated in FIG. 1, and/or the HMD device 800 illustrated in FIG. 10. Computing system 900 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 900 includes a logic processor 902 volatile memory 904, and a non-volatile storage device 906. Computing system 900 may optionally include a display subsystem 908, input subsystem 910, communication subsystem 912, and/or other components not shown in FIG. 11.

Logic processor 902 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 902 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 906 includes one or more physical devices configured to hold instructions executable by the logic processors to implement the methods and processes described herein. When such methods and processes are implemented, the state of non-volatile storage device 906 may be transformed—e.g., to hold different data.

Non-volatile storage device 906 may include physical devices that are removable and/or built-in. Non-volatile storage device 906 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 906 may include nonvolatile, dynamic, static, read/write, read-only, sequential-access, location-addressable, file-addressable, and/or content-addressable devices. It will be appreciated that non-volatile storage device 906 is configured to hold instructions even when power is cut to the non-volatile storage device 906.

Volatile memory 904 may include physical devices that include random access memory. Volatile memory 904 is typically utilized by logic processor 902 to temporarily store information during processing of software instructions. It will be appreciated that volatile memory 904 typically does not continue to store instructions when power is cut to the volatile memory 904.

Aspects of logic processor 902, volatile memory 904, and non-volatile storage device 906 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 900 typically implemented in software by a processor to perform a particular function using portions of volatile memory, which function involves transformative processing that specially configures the processor to perform the function. Thus, a module, program, or engine may be instantiated via logic processor 902 executing instructions held by non-volatile storage device 906, using portions of volatile memory 904. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 908 may be used to present a visual representation of data held by non-volatile storage device 906. The visual representation may take the form of a graphical user interface (GUI). As the herein described methods and processes change the data held by the non-volatile storage device, and thus transform the state of the non-volatile storage device, the state of display subsystem 908 may likewise be transformed to visually represent changes in the underlying data. Display subsystem 908 may include one or more display devices utilizing virtually any type of technology. Such display devices may be combined with logic processor 902, volatile memory 904, and/or non-volatile storage device 906 in a shared enclosure, or such display devices may be peripheral display devices.

When included, input subsystem 910 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 912 may be configured to communicatively couple various computing devices described herein with each other, and with other devices. Communication subsystem 912 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 900 to send and/or receive messages to and/or from other devices via a network such as the Internet.

The following paragraphs provide additional support for the claims of the subject application. One aspect provides a micro electro mechanical system comprising a first part bonded to a second part by a structural adhesive interface, the structural adhesive interface including a conductive structural adhesive portion, and a non-conductive structural adhesive portion at least partially surrounding the conductive structural adhesive portion, wherein the conductive structural adhesive portion and the non-conductive structural adhesive portion have a thixotropy index greater than one. In this aspect, additionally or alternatively, the micro electro mechanical system may be a scanning mirror system that includes a mirror, the first part, and the second part, and the first part may be a moveable member and the second part may be an electromechanical actuator. In this aspect, additionally or alternatively, the scanning mirror system may comprise an actuator frame, comprising a mounting member, a first movable member, a second moveable member, a first hinge connecting a central portion of the mounting member with the first movable member, and a second hinge connecting the central portion of the mounting member with the second moveable member, the scanning mirror system may further comprise a plurality of electromechanical actuators bonded to the first moveable member and the second moveable member via structural adhesive interfaces, and a scanning mirror assembly bonded to the first moveable member and the second moveable member. In this aspect, additionally or alternatively, the micro electro mechanical system may further comprise a controller is configured to control a tilt of the mirror of the scanning mirror assembly by driving an electrical signal to the plurality of electromechanical actuators conducted through at least the conductive structural adhesive portion of the structural adhesive interfaces. In this aspect, additionally or alternatively, the structural adhesive may have a shear strength greater than twenty megapascals. In this aspect, additionally or alternatively, the structural adhesive interface may have a viscosity greater than 1000 mPa-sec at 25° C. In this aspect, additionally or alternatively, the structural adhesive interface may be a thermoset material. In this aspect, additionally or alternatively, the structural adhesive interface may have a cure time of less than 60 minutes. In this aspect, additionally or alternatively, the structural adhesive interface may have a coefficient of thermal expansion of less than 60 ppm/° C. In this aspect, additionally or alternatively, the conductive structural adhesive portion and the non-conductive structural adhesive portion may be concurrently cured.

Another aspect provides a method for bonding a first part and a second part of a micro electro mechanical system comprising depositing a structural adhesive interface onto a surface of the first part, the structural adhesive interface including a conductive structural adhesive portion, a non-conductive structural adhesive portion at least partially surrounding the conductive structural adhesive portion, wherein the conductive structural adhesive portion and the non-conductive structural adhesive portion have a thixotropy index greater than one, and curing the structural adhesive interface. In this aspect, additionally or alternatively, the structural adhesive interface may have a shear strength greater than twenty megapascals. In this aspect, additionally or alternatively, the structural adhesive interface may have a viscosity greater than 1000 mPa-sec at 25° C. In this aspect, additionally or alternatively, the structural adhesive interface may have a cure time of less than 60 minutes. In this aspect, additionally or alternatively, the structural adhesive interface may have a coefficient of thermal expansion of less than 60 ppm/° C. In this aspect, additionally or alternatively, the conductive structural adhesive portion and the non-conductive structural adhesive portion may be concurrently cured.

Another aspect provides a display device, comprising a light source, a scanning mirror system configured to scan light from the light source, and a controller configured to control the scanning mirror system, wherein the scanning mirror system includes components bonded by a structural adhesive, the structural adhesive including a conductive structural adhesive portion, and a non-conductive structural adhesive portion at least partially surrounding the conductive structural adhesive portion, wherein the conductive structural adhesive portion and the non-conductive structural adhesive portion have a thixotropy index greater than one. In this aspect, additionally or alternatively, the scanning mirror system may comprise an actuator frame, comprising a mounting member, a first movable member, a second moveable member, a first hinge connecting a central portion of the mounting member with the first movable member, and a second hinge connecting the central portion of the mounting member with the second moveable member, and the scanning mirror system may further comprise a plurality of electromechanical actuators bonded to the first moveable member and the second moveable member via structural adhesive interfaces, and a scanning mirror assembly bonded to the first moveable member and the second moveable member. In this aspect, additionally or alternatively, the controller may be configured to control a tilt of the mirror of the scanning mirror assembly by driving an electrical signal to the plurality of electromechanical actuators conducted through at least the conductive structural adhesive portion of the structural adhesive interfaces. In this aspect, additionally or alternatively, the display device may be incorporated in a head mounted display device.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A micro electro mechanical system comprising:
 a first part bonded to a second part by a structural adhesive interface, the structural adhesive interface including:
  a conductive structural adhesive portion; and
  a non-conductive structural adhesive portion at least partially surrounding the conductive structural adhesive portion;
  wherein the conductive structural adhesive portion and the non-conductive structural adhesive portion have a thixotropy index greater than one.

2. The micro electro mechanical system of claim 1, wherein the micro electro mechanical system is a scanning mirror system that includes a mirror, the first part, and the second part; and
 wherein the first part is a moveable member and the second part is an electromechanical actuator.

3. The micro electro mechanical system of claim 2, the scanning mirror system comprising:
 an actuator frame, comprising a mounting member, a first movable member, a second moveable member, a first hinge connecting a central portion of the mounting member with the first movable member, and a second hinge connecting the central portion of the mounting member with the second moveable member;
 a plurality of electromechanical actuators bonded to the first moveable member and the second moveable member via structural adhesive interfaces; and
 a scanning mirror assembly bonded to the first moveable member and the second moveable member.

4. The micro electro mechanical system of claim 3, further comprising a controller configured to control a tilt of the mirror of the scanning mirror assembly by driving an electrical signal to the plurality of electromechanical actuators conducted through at least the conductive structural adhesive portion of the structural adhesive interfaces.

5. The micro electro mechanical system of claim 1, wherein the structural adhesive interface has a shear strength greater than twenty megapascals.

6. The micro electro mechanical system of claim 1, wherein the structural adhesive interface has a viscosity greater than 1000 mPa-sec at 25° C.

7. The micro electro mechanical system of claim 1, wherein the structural adhesive interface is a thermoset material.

8. The micro electro mechanical system of claim 7, wherein the structural adhesive interface has a cure time of less than 60 minutes.

9. The micro electro mechanical system of claim 7, wherein the structural adhesive interface has a coefficient of thermal expansion of less than 60 ppm/° C.

10. The micro electro mechanical system of claim 7, wherein the conductive structural adhesive portion and the non-conductive structural adhesive portion are concurrently cured.

11. A method for bonding a first part and a second part of a micro electro mechanical system comprising:
 depositing a structural adhesive interface onto a surface of the first part, the structural adhesive interface including:
  a conductive structural adhesive portion;
  a non-conductive structural adhesive portion at least partially surrounding the conductive structural adhesive portion; and
  wherein the conductive structural adhesive portion and the non-conductive structural adhesive portion have a thixotropy index greater than one; and
 curing the structural adhesive interface.

12. The method of claim 11, wherein the structural adhesive interface has a shear strength greater than twenty megapascals.

13. The method of claim 11, wherein the structural adhesive interface has a viscosity greater than 1000 mPa-sec at 25° C.

14. The method of claim 11, wherein the structural adhesive interface has a cure time of less than 60 minutes.

15. The method of claim 11, wherein the structural adhesive interface has a coefficient of thermal expansion of less than 60 ppm/° C.

16. The method of claim 11, wherein the conductive structural adhesive portion and the non-conductive structural adhesive portion are concurrently cured.

17. A display device, comprising:
 a light source;
 a scanning mirror system configured to scan light from the light source; and
 a controller configured to control the scanning mirror system;
 wherein the scanning mirror system includes components bonded by a structural adhesive, the structural adhesive including:
  a conductive structural adhesive portion; and
  a non-conductive structural adhesive portion at least partially surrounding the conductive structural adhesive portion; and
  wherein the conductive structural adhesive portion and the non-conductive structural adhesive portion have a thixotropy index greater than one.

18. The display device of claim 17, the scanning mirror system comprising:

an actuator frame, comprising a mounting member, a first movable member, a second moveable member, a first hinge connecting a central portion of the mounting member with the first movable member, and a second hinge connecting the central portion of the mounting member with the second moveable member;

a plurality of electromechanical actuators bonded to the first moveable member and the second moveable member via structural adhesive interfaces; and a scanning mirror assembly bonded to the first moveable member and the second moveable member.

19. The display device of claim 18, wherein the controller is configured to control a tilt of the mirror of the scanning mirror assembly by driving an electrical signal to the plurality of electromechanical actuators conducted through at least the conductive structural adhesive portion of the structural adhesive interfaces.

20. The display device of claim 17, incorporated in a head mounted display device.

* * * * *